US006306742B1

(12) United States Patent
Doyle et al.

(10) Patent No.: US 6,306,742 B1
(45) Date of Patent: Oct. 23, 2001

(54) METHOD FOR FORMING A HIGH DIELECTRIC CONSTANT INSULATOR IN THE FABRICATION OF AN INTEGRATED CIRCUIT

(75) Inventors: Brian Doyle, Cupertino, CA (US); Jack Lee, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/225,659

(22) Filed: Jan. 5, 1999

Related U.S. Application Data

(63) Continuation of application No. 08/771,304, filed on Dec. 20, 1996.

(51) Int. Cl.$^7$ .................................................. H01L 21/70
(52) U.S. Cl. ..................... 438/591; 435/624; 435/659; 435/694; 435/700; 435/795; 435/791
(58) Field of Search ................... 438/591, 624, 438/659, 775, 791, 694, 703

(56) References Cited

U.S. PATENT DOCUMENTS

| | | |
|---|---|---|
| 4,262,056 | 4/1981 | Hubler et al. . |
| 4,671,845 | 6/1987 | Yoder . |
| 4,897,368 | 1/1990 | Kobushi et al. . |
| 4,948,742 | 8/1990 | Nishimura et al. . |
| 5,508,881 * | 4/1996 | Stevens .................................. 361/305 |
| 5,514,902 | 5/1996 | Kawasaki et al. . |
| 5,596,218 | 1/1997 | Soleimani et al. . |
| 5,629,888 | 5/1997 | Saito et al. . |
| 5,672,251 | 9/1997 | Goto et al. . |
| 5,672,521 | 9/1997 | Barsan et al. . |
| 5,723,381 | 3/1998 | Grewal et al. . |
| 5,726,087 | 3/1998 | Tseng et al. . |
| 5,741,721 * | 4/1998 | Stevens ................................... 437/60 |
| 5,792,679 | 8/1998 | Nakato . |
| 5,891,798 * | 4/1999 | Doyle et al. .......................... 438/624 |

OTHER PUBLICATIONS

Kusunoki, S., et al.; "Hot–Carrier–Resistant Structure by Re–Oxidized Nitrided Oxide Sidewall for Highly Reliable and High Prformance LDD MOSFETS"; *IEEE*, 1991; pp. 91–649/91–652.

Doyle, B., et al.; "Simultaneous Growth of Different Thickness Gates Oxides in Silicon CMOS Processing"; *IEEE Electron Device Letters*, vol. 16, No. 7, Jul. 1995; pp. 301–302.

Desu, S. B.; "Influence of Stresses on the Properties of Ferroelectric BaTiO$_3$ Thin Films"; *J. Electrochem. Soc.*, vol. 140, No. 10, Oct. 1993; pp. 2981–2987.

Shimizu, S., et al.; "0.15$_\mu$m CMOS Process for High Performance and High Reliability"; *IEEE* 1994; pp. 4.1.1–4.1.4.1.4.

Kingon, A.I.; "Ferroelectric Thin Films"; *MRS Short Course*, Boston, Dec. 1–2, 1993; one page.

* cited by examiner

*Primary Examiner*—David Nelms
*Assistant Examiner*—Reneé R. Berry
(74) *Attorney, Agent, or Firm*—Robert G. Winkle

(57) ABSTRACT

A method for forming an insulator with a high dielectric constant on silicon is disclosed. This method overcomes one limitation of increasing the dielectric constant of a gate dielectric by using a high dielectric constant material, such as a paraelectric material, instead of silicon dioxide. First, nitrogen is implanted into the silicon through a sacrificial oxide layer. After annealing the substrate and stripping the sacrificial oxide, a dielectric layer is formed from a material with a high dielectric constant, such as a paraelectric material. Although the paraelectric material provides a source of oxygen for oxidation of silicon in subsequent high temperature process steps, no oxidation takes place due to the presence of the nitrogen in the silicon. Therefore, there is no undesired decrease in the overall capacitance of the dielectric system. When a gate electrode is formed on the dielectric layer, a nitrogen implant into the gate electrode can be used to prevent oxidation at the upper interface of the gate dielectric.

11 Claims, 5 Drawing Sheets

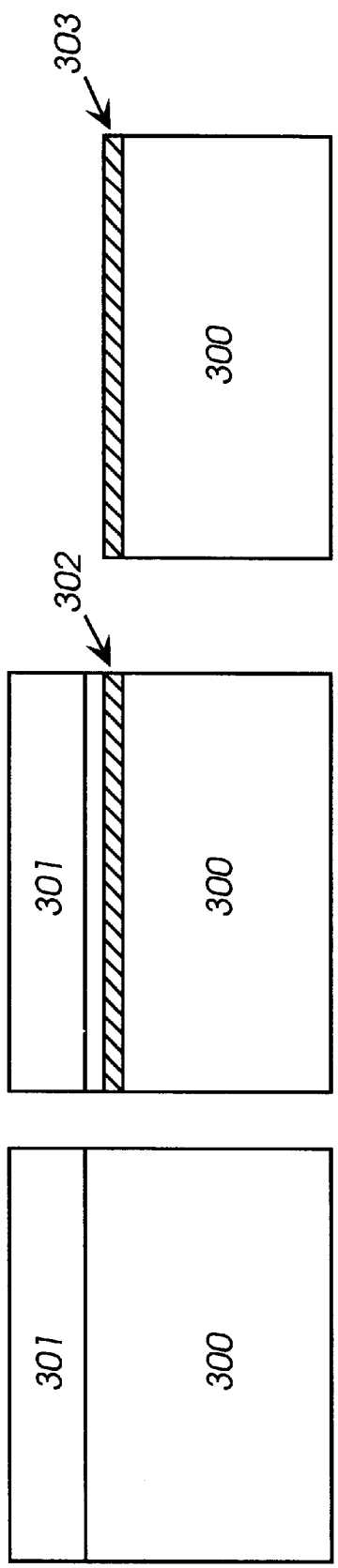

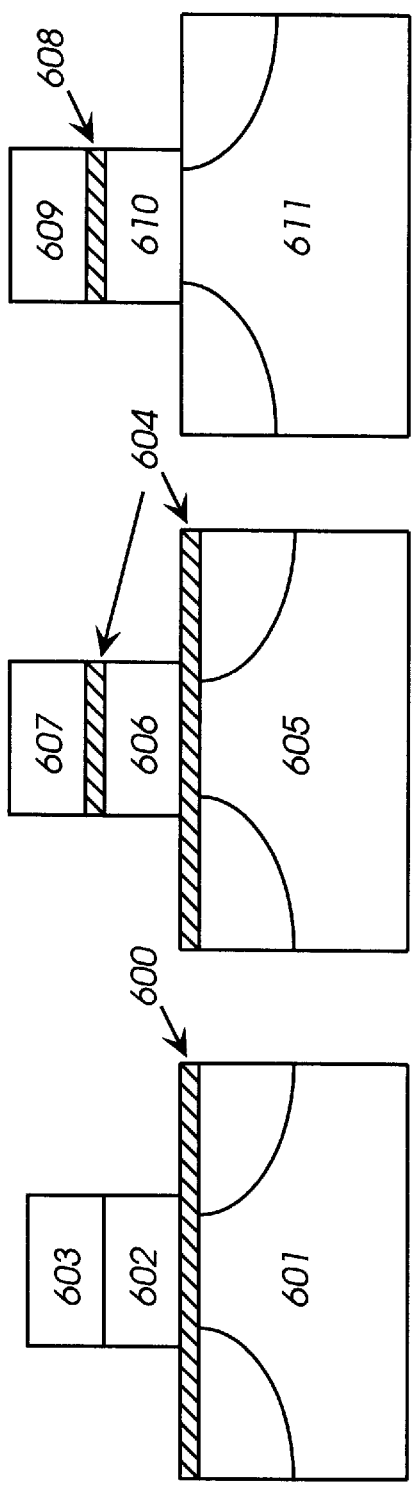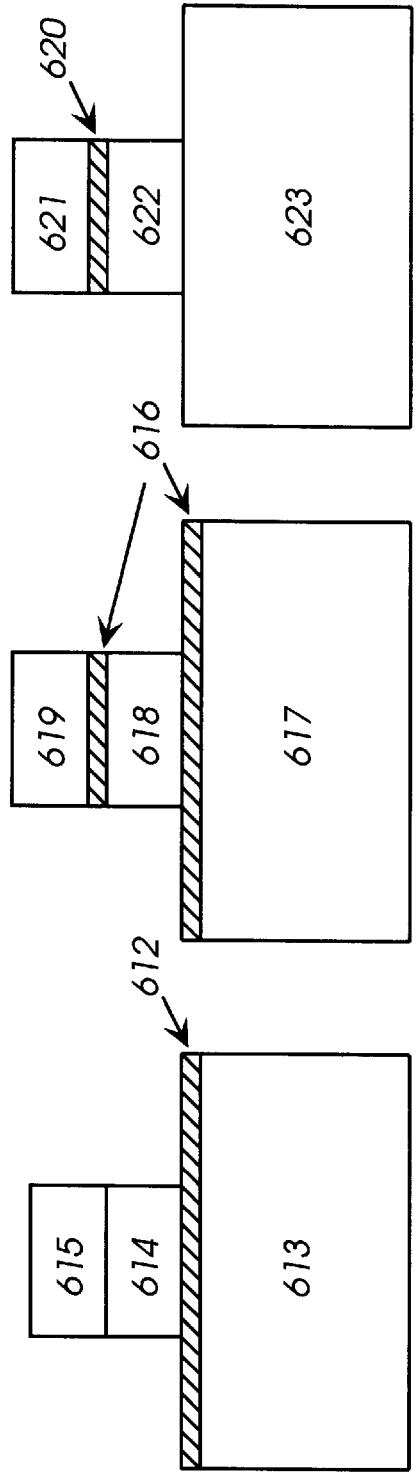
FIG. 6a  FIG. 6b  FIG. 6c
FIG. 6d  FIG. 6e  FIG. 6f

METHOD FOR FORMING A HIGH DIELECTRIC CONSTANT INSULATOR IN THE FABRICATION OF AN INTEGRATED CIRCUIT

This is a continuation application of Ser. No. 08/771,304 filed: Dec. 20, 1996.

FIELD OF THE INVENTION

The present invention relates to the field of semiconductor processing and more particularly to a method for forming a dielectric layer in an integrated circuit.

BACKGROUND OF THE INVENTION

A desire to increase the speed and density of integrated circuits (ICs) has led to transistor scaling accompanied by progressive reductions in the thickness of the gate oxide. A thinner gate oxide provides greater drive current, thereby increasing speed. Also, a thinner gate oxide provides greater control over the channel charge, thereby reducing short channel effects. However, thinner gate oxides present greater problems of manufacturability, quality, and reliability.

One way to avoid the problems of a thinner gate oxide but achieve the desired capacitive effect is to replace the gate oxide with a gate dielectric that has a greater dielectric constant than silicon dioxide. Paraelectric materials have dielectric constants that are usually at least two orders of magnitude above that of silicon dioxide, but several problems limit their use as gate dielectrics. One such problem is illustrated in FIGS. 1a and 1b. FIG. 1a is a cross sectional illustration of a prior dielectric system before any high temperature processing has occurred, such as source/drain dopant activation, and FIG. 1b is a cross sectional illustration of the same dielectric system after high temperature processing has occurred. During these high temperature processes, oxygen diffuses from gate dielectric 101 to interface 102 between gate dielectric 101 and gate electrode 103, and to interface 104 between gate dielectric 101 and channel 105. The diffused oxygen forms oxide layer 106 at these interfaces, decreasing the overall capacitance of the dielectric system and partially counteracting the effect of the high dielectric constant paraelectric material.

Therefore, a better way to form a high dielectric constant insulator in the fabrication of an integrated circuit is desired.

SUMMARY OF THE INVENTION

A method for forming an insulator with a high dielectric constant in the fabrication of an integrated circuit is disclosed. First, the substrate on which the integrated circuit is being fabricated is nitridated. Then, a dielectric layer which has a dielectric constant higher than that of silicon dioxide is formed.

BRIEF DESCRIPTION OF THE DRAWINGS

FIG. 3a is a cross sectional illustration of a sacrificial oxide on a substrate.

FIG. 3b is an illustration of the substrate of FIG. 3a after a nitrogen implant.

FIG. 3c is an illustration of the substrate of FIG. 3b after anneal and oxide removal.

FIG. 6a is an illustration of a MOSFET that has been fabricated using the present invention for the substrate only.

FIG. 6b is an illustration of a MOSFET that has been fabricated using the present invention for both the substrate and the gate electrode.

FIG. 6c is an illustration of a MOSFET that has been fabricated using the present invention for the gate electrode only.

FIG. 6d is an illustration of a capacitor that has been fabricated using the present invention for the bottom electrode only.

FIG. 6e is an illustration of a capacitor that has been fabricated using the present invention for both the bottom and top electrodes.

FIG. 6f is an illustration of a capacitor that has been fabricated using the present invention for the top electrode only.

DETAILED DESCRIPTION OF A PREFERRED EMBODIMENT

A method of forming an insulator with a high dielectric constant in the fabrication of an integrated circuit is described. In the following description, numerous specific details are set forth in order to provide a thorough understanding of the present invention. It will be obvious, however, to one skilled in the art that the present invention can be practiced without these specific details. In other instances, some details have been omitted in order to avoid obscuring the present invention.

The present invention provides a way to form a high dielectric constant insulator with no substantial reduction in the capacitance of the dielectric system due to parasitic oxide growth Therefore, the full benefit of using a high dielectric constant material instead of silicon dioxide to fabricate faster, denser devices can be realized.

Figure 1B:
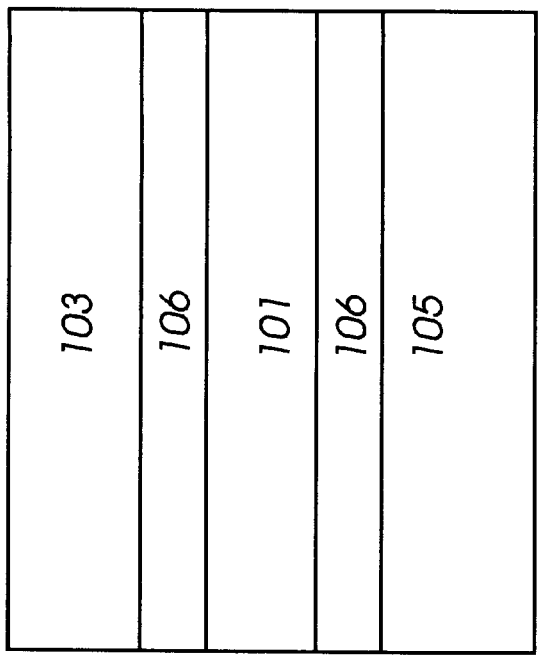
FIG. 1b is an illustration of the dielectric system of FIG. 1a after high temperature processing has occurred.
Figure 1A:
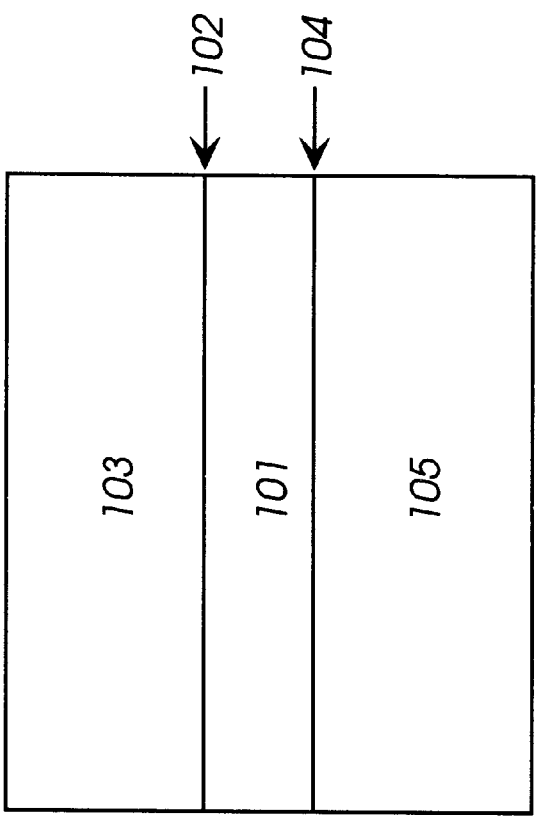
FIG. 1a is a cross sectional illustration of a prior art dielectric system before any high temperature processing has occurred.
Figure 2:
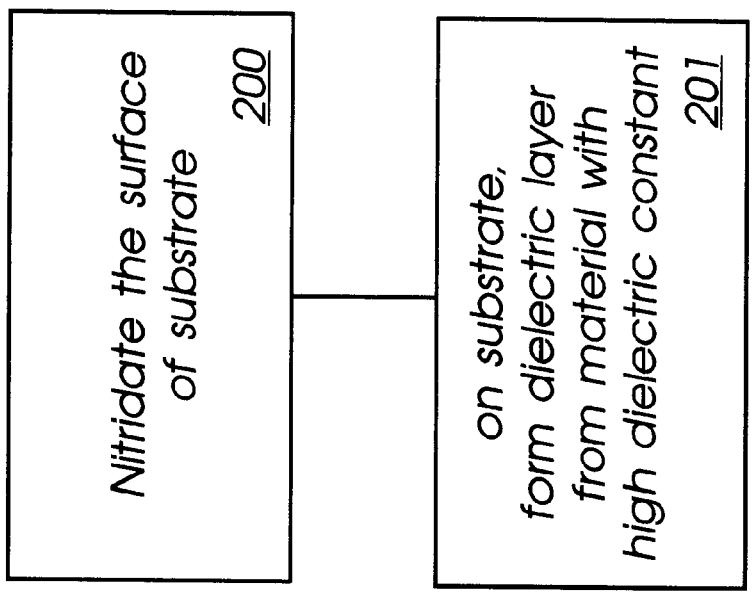
FIG. 2 is a flow chart illustrating the formation of a high dielectric constant insulator in accordance with one embodiment of the present invention.
Figure 5:
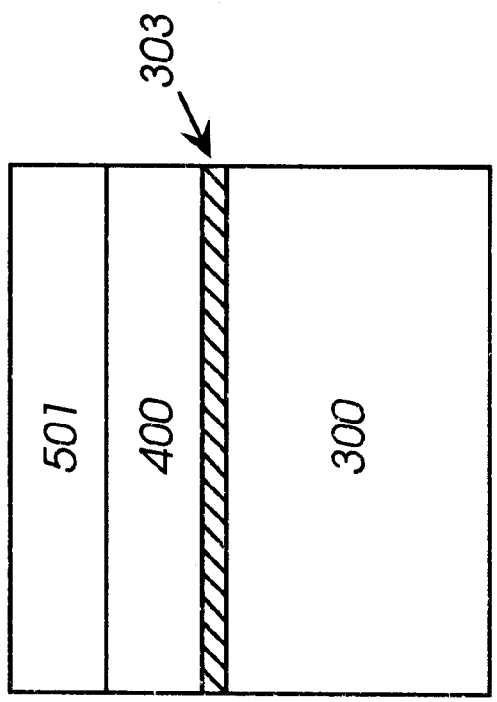
FIG. 5 is an illustration of the substrate of FIG. 4 after a conductive layer is formed.

The formation of a high dielectric constant insulator in accordance with one embodiment of the present invention is illustrated by the flow chart of FIG. 2. In step 200 of FIG. 2, the surface of a substrate is nitridated. The substrate can be semiconductor or a conductor. In a preferred embodiment the substrate is silicon.

Nitridation can be accomplished by providing a source of nitrogen and incorporating the nitrogen into the surface of the silicon, preferably as a monolayer of material similar to but perhaps not measurable as silicon nitride ($Si_3N_4$). In a preferred embodiment illustrated in FIGS. 3a through 3c, a source of nitrogen is provided by ion implantation. First, a thin (approximately 15 nm) layer of sacrificial oxide is grown on the silicon by heating the silicon to between approximately 800 and 1000 degrees C for between approximately ten and sixty minutes in the presence of oxygen. Purposes of the sacrificial oxide include protection of the silicon from contamination, implant damage, and channeling, so it is preferable that the sacrificial oxide be thick enough to serve those purpose. If desired, however, the sacrificial oxide can be thicker, thinner, omitted, or formed by other means within the scope of the present invention. Sacrificial oxide 301 on substrate 300 is illustrated in FIG. 3a.

Next, nitrogen is implanted into the silicon, preferably with an implant energy that places the peak concentration, shown as 302 in FIG. 3b, just below the interface between the oxide and the silicon. It is also possible to place the peak concentration at the interface, in the oxide, deeper in the silicon within the scope of the present invention. A preferred implant energy is approximately 30 KeV, but can vary depending on the thickness of the oxide is and the desired location of the peak concentration. The desired effect of the nitrogen is to substantially prevent the oxidation of the silicon surface, so it is important that the dose of the nitrogen implant be great enough to serve that purpose. In *IEEE Electron Device Letters*, Vol. 16, No. 7, pp. 301–302 (July 1995), Doyle et. al. demonstrate the inhibition of oxidation of a silicon surface beginning at a nitrogen implant dose between 1E14 and 1E15. At doses above 1E15 oxidation is substantially prevented. Therefore, a dose of at least 1E15 ions/cm$^2$ is preferred.

Continuing with the nitridation step of this preferred embodiment, the nitrogen is incorporated into the surface of the silicon by heating or annealing the silicon, preferably to a temperature between approximately 800 to 1000 degrees C for approximately two minutes. In a preferred embodiment the anneal is performed in a Rapid Thermal Processing system as the next process step following the implant step, but, if desired, can be performed in an alternative equipment, such as a furnace, and at an alternative time, for example after some intervening process steps. It is also possible within the scope of the present invention to combine the anneal with an existing or other new process step that is performed for another purpose, such as for dopant activation. The purpose of the anneal step in this embodiment of the present invention is to drive nitrogen to the interface between the silicon and the sacrificial oxide where it combines with silicon to form a material such as or similar to silicon nitride. Therefore, it is preferable that the temperature and the time of the anneal are sufficient to serve that purpose without being so great as to impractically add to the overall process time or thermal exposure.

In this preferred embodiment wherein the anneal step is the next process step after the implant step, the sacrificial oxide, if used, is removed following the anneal step. Sacrificial oxide removal is accomplished by well known means such as a dip in a solution containing hydrofluoric acid. FIG. 3c shows the substrate of FIG. 3b, now with nitridated surface 303, following anneal and oxide removal.

Alternative techniques for nitridating the surface of the substrate are possible within the scope of the present invention. In *IEEE IEDM*, Vol. 91, pp. 649–652 (1991) Kusonoki et al. describe the nitridation of a gate oxide to increase the hot carrier resistance of a metal-oxide-semiconductor field effect transistor (MOSFET). Such a nitridation technique can be used as one alternative to the nitrogen implant technique described above. For example, a thin (approximately 15 nm) layer of sacrificial oxide can be grown on the silicon substrate by well known means. Then, the substrate can be heated in the presence of ammonia (NH$_3$) to nitridate the sacrificial oxide. During nitridation, some nitrogen diffuses through the oxide to the interface of the silicon and the sacrificial oxide to form a monolayer or more of a material such as or similar to silicon nitride. Then, the sacrificial oxide can be stripped by well known means to leave the silicon substrate covered with a monolayer or more of the silicon nitride like material.

Figure 4:
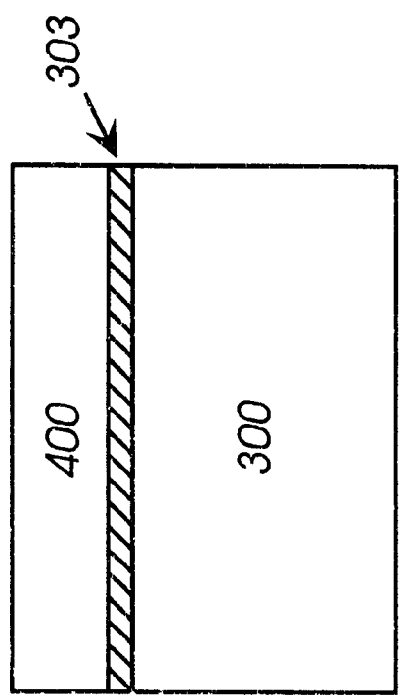
FIG. 4 is an illustration of the substrate of FIG. 3c after a dielectric layer is formed.

Returning to the flow chart of FIG. 2, after completion of nitridation step 200, step 201 is performed to form dielectric layer 400, as shown in FIG. 4, on the substrate. The material from which dielectric layer 400 is formed has a higher dielectric constant than that of silicon dioxide, so that dielectric layer 400 can provide the same capacitance as a thinner layer of silicon dioxide. Any such material can be used, but materials that are paraelectrics, ferroelectrics, or antiferroelectrics are preferred because these materials have been investigated for applications in the fabrication of memory devices. The preferred paraelectric materials include barium strontium titanate (Ba$_x$Sr$_{1-x}$TiO$_3$) and lanthanum-doped lead zirconium titanate (PbZr$_x$Ti$_{1-x}$O$_3$). Although these two materials, like other dielectric materials usable within the scope of the present invention, contain oxygen, this oxygen does not cause a substantial oxidation of the surface of the substrate because the surface has been nitridated. Therefore, the capacitance of the dielectric system formed according to the present invention is not reduced by parasitic oxide layer.

In a preferred embodiment dielectric layer 400 is formed by sputter deposition of barium strontium titanate at a temperature between 300 and 700 degrees C as described by Desu in *J. Electrochem. Soc.*, Vol. 140, No. 10, pp. 2981–2987 (October 1993). The temperature is not too high or too low to produce a sputtered layer with stress properties conducive to reliability. Other techniques for forming dielectric layer 400, such as evaporation, are also possible. The thickness of dielectric layer 400 is determined by the dielectric constant of the material and the desired capacitance of the dielectric system. The present invention requires no minimum or maximum thickness, but the invention is most useful when the thickness is such that the capacitance is equal to a silicon dioxide layer that is less than approximately 3 nm thick because the manufacturability and reliability of silicon dioxide films is presently inadequate for thicknesses below 3 nm. If dielectric layer 400 is too thick, it would be more practical to use silicon dioxide as the dielectric.

The formation of dielectric layer 400 completes the fabrication of a high dielectric constant insulator according to this embodiment of the present invention. The high dielectric constant insulator formed according to this embodiment can be used as the dielectric in a MOSFET or a capacitor according to another embodiment of the present invention. Note that substrate 300 as shown in FIG. 4 can be a semiconductor or a conductor, such as doped polysilicon, within the scope of the present invention.

To fabricate a MOSFET or capacitor using dielectric layer 400 on substrate 300, the first step is to form, on dielectric layer 400, a conductive layer 501 from which a gate or top electrode will be formed. Conductive layer 501 can be formed from any conductive material, but certain materials, such as iridium, iridium oxide, platinum, ruthenium, and ruthenium oxide, are preferred when the dielectric material is a paraelectric material. With some of these materials the use of the present invention to prevent oxidation of conductive 501 layer may not be necessary or desired, but with other materials the invention can be used for conductive layer 501 in addition to or instead of substrate 300. For example, conventional polysilicon can be used for conductive layer 501 within the scope of the present invention, in which case the present invention can be used to prevent oxidation of either conductive layer 501 or substrate 300, or both. In one embodiment conductive layer 501 is a 200 nm thick layer of polysilicon formed by chemical vapor deposition.

If the present invention is to be used to prevent oxidation of the conductive layer 501, the surface of conductive layer 501 that is in contact with dielectric layer 400 is nitridated.

In a preferred embodiment where conductive layer 501 is polysilicon, nitridation is accomplished by implanting nitrogen into the polysilicon as described by Shimizu et. al. in *IEEE IEDM*, Vol. 94, pp. 67–70 (1994), then annealing the polysilicon to drive the nitrogen to the interface of the dielectric layer and the polysilicon. At the interface, the nitrogen is incorporated, preferably as a monolayer or more of a material such as or similar to silicon nitride. The purpose of the nitridation of the polysilicon is to prevent oxidation during subsequent high temperature process steps despite the presence of oxygen from the dielectric layer. To accomplish that purpose, a nitrogen implant dose of at least 1E15 is preferred.

If conductive layer 501 is nitridated, conductive layer 501 can be patterned and etched to form the gate or top electrode of a transistor or capacitor either before or after the nitridation step. FIG. 6*a* is an illustration of a MOSFET that has been fabricated using the present invention for the substrate only, having nitridated surface 600 between channel 601 and gate dielectric 602, but having no nitridated surface between gate dielectric 602 and gate electrode 603. FIG. 6*b* is an illustration of a MOSFET that has been fabricated using the present invention for both the substrate and the gate electrode, having nitridated surfaces 604 between channel 605 and gate dielectric 606 as well as between gate dielectric 606 and gate electrode 607. FIG. 6*c* is an illustration of a MOSFET that has been fabricated using the present invention for the gate electrode only, having nitridated surface 608 between gate electrode 609 and gate dielectric 610 but having no nitridated surface between gate dielectric 610 and channel 611. FIG. 6*d* is an illustration of a capacitor that has been fabricated using the present invention for the bottom electrode only, having nitridated surface 612 between bottom electrode 613 and gate dielectric 614, but having no nitridated surface between gate dielectric 614 and top electrode 615. FIG. 6*e* is an illustration of a capacitor that has been fabricated using the present invention for both the bottom and top electrodes, having nitridated surfaces 616 between bottom electrode 617 and gate dielectric 618 as well as between gate dielectric 618 and top electrode 619.

FIG. 6*f* is an illustration of a capacitor that has been fabricated using the present invention for the top electrode only, having nitridated surface 620 between top electrode 621 and gate dielectric 622 but having no nitridated surface between gate dielectric 622 and channel 621.

What is claimed is:

1. A method for forming an insulator on a substrate, said method comprising the steps of:

nitridating said substrate; and forming a dielectric layer having a dielectric constant greater than the dielectric constant of silicon dioxide on said substrate.

2. The method of claim 1 wherein said nitridation substantially prevents a subsequent oxidation of said substrate.

3. The method of claim 1 wherein said nitridation comprises a nitrogen implant.

4. The method of claim 3 wherein the nitrogen implant dose is great enough to substantially prevent a subsequent oxidation of said substrate.

5. The method of claim 1 wherein said dielectric layer comprises a paraelectric material.

6. A method for forming an insulator on a substrate, said method comprising the steps of:

nitridating said substrate; and depositing a dielectric layer on said substrate.

7. The method of claim 6 wherein the dielectric constant of said dielectric layer is greater than the dielectric constant of silicon dioxide.

8. The method of claim 6 wherein said nitridation comprises a nitrogen implant.

9. The method of claim 6 wherein said dielectric layer comprises a paraelectric material.

10. The method of claim 6 further comprising a step of heating said substrate after the nitridation step and prior to the deposition step.

11. The method of claim 8 wherein the dose of said nitrogen implant is at least 1E15 ions per square centimeter.

* * * * *